(12) United States Patent
Panda et al.

(10) Patent No.: US 7,645,356 B2
(45) Date of Patent: Jan. 12, 2010

(54) METHOD OF PROCESSING WAFERS WITH RESONANT HEATING

(75) Inventors: Siddhartha Panda, Beacon, NY (US); Richard S. Wise, New Windsor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/721,657

(22) Filed: Nov. 25, 2003

(65) Prior Publication Data

US 2005/0112900 A1    May 26, 2005

(51) Int. Cl.
*C23F 1/00* (2006.01)
(52) U.S. Cl. .................. 156/345.3; 156/345.34; 438/731
(58) Field of Classification Search .......... 438/706, 438/710, 731; 156/345.3, 34; 356/450; 216/12, 216/41, 48
See application file for complete search history.

(56) References Cited

U.S. PATENT DOCUMENTS

| | | | |
|---|---|---|---|
| 4,135,027 A * | 1/1979 | Anthony et al. .......... 428/195.1 |
| 5,650,082 A | 7/1997 | Anderson | |
| 5,686,224 A * | 11/1997 | O'Neill ................. 430/320 |
| 5,748,296 A * | 5/1998 | Canteloup .............. 356/72 |
| 5,861,609 A | 1/1999 | Kaltenbrunner et al. | |
| 5,991,508 A | 11/1999 | Ohmine et al. | |
| 6,569,580 B2 * | 5/2003 | Campi et al. ............. 430/5 |
| 6,809,797 B2 * | 10/2004 | Baselmans et al. .......... 355/52 |
| 6,867,420 B2 * | 3/2005 | Mathies et al. ......... 250/458.1 |
| 2002/0017618 A1 | 2/2002 | Gat et al. | |

FOREIGN PATENT DOCUMENTS

| | | | |
|---|---|---|---|
| JP | 54059879 A | 5/1979 |
| JP | 10340890 A | 12/1998 |
| JP | 2000077349 A | 3/2000 |
| JP | 2001085408 A | 3/2001 |

* cited by examiner

*Primary Examiner*—Lan Vinh
(74) *Attorney, Agent, or Firm*—George R. McGuire; Bond, Schoeneck & King, PLLC (57) ABSTRACT

A method of etching a wafer using resonant infrared energy and a filter to control non-uniformities during plasma etch processing. The filter includes a predetermined array or stacked arrangement of variable transmission regions that mirror the spatial etch distortions caused by the plasma etching process. By spatially attenuating the levels of IR energy that reach the wafer, the filter improves uniformity in the etching process. Filters may be designed to compensate for edge fast etching due to macro-loading, asymmetric pumping in a plasma chamber, and magnetic field cusping.

11 Claims, 9 Drawing Sheets

METHOD OF PROCESSING WAFERS WITH RESONANT HEATING

BACKGROUND OF THE INVENTION

1. Field of Invention

The present invention relates to the manufacture of silicon wafers and, more specifically, to a method of using a filter to control non-uniformities in wafer processing using resonant heating.

2. Description of Prior Art

Silicon wafers may be processed using plasma etch reactors. Layers of conducting or insulating material are deposited onto a silicon wafer and circuit features are etched into the wafer by bombarding the wafer with a reactive gas and an ion stream in near-vacuum conditions to carve out circuit features. Plasma processing has some drawbacks, however, as it often results in spatial non-uniformity at both the wafer and chip scale.

At the wafer scale, the design of the plasma chamber can adversely affect the gas flow profiles and the plasma itself may exacerbate etching at the wafer edge due to the high density of hot electrons and radicals. At the chip scale, loading adversely affects etch profiles that, for example, may have isolated to nested bias. As a result of these shortcomings, the full capability of plasma etching is unrealized and the overall process yields lower amounts of finished product than otherwise possible.

Some attempts to alleviate center/edge non-uniformity involve cooling the backside of the wafer with helium. This method does not provide selective or precise control over the etching process, however, as the temperature gradients are smoothed from the back to the front of the wafer and the same chilling substance is used for all zones. Additionally, the plasma heating generally dominates the thermal characteristics of the wafer surface, thereby reducing the impact of any helium cooling.

Other attempts to overcome the disadvantages of plasma processing involve the use of masks that reduce the amount of IR heating to selected areas of the wafer or multiple energy sources for differential heating. The systems are generally limited to inhibiting heating at the edge of the wafer or are extremely limited in their ability to provide high-resolution selection.

3. Objects and Advantages

It is a principal object and advantage of the present invention to improve the overall uniformity of plasma-etched wafers.

It is an additional object and advantage of the present invention to provide a method of reducing complex non-uniformities in a plasma-etched wafer.

It is a further object and advantage of the present invention to provide a system for reducing complex non-uniformities that result from multiple anomalies in the plasma etching process.

Other objects and advantages of the present invention will in part be obvious, and in part appear hereinafter.

SUMMARY OF THE INVENTION

The present invention comprises a method of improving the etching of silicon wafers by using an infrared (IR) heating device which applies resonant energy through an IR filter that spatially attenuates the strength of the radiation to compensate for spatial etch distortions. The use of resonant IR in combination with a filter for selectively controlling the location where energy is applied provides a high degree of resolution, thereby allowing for improved wafer processing. The filter comprises a predetermined array of variable transmission regions that mirror the spatial etch distortions caused by the plasma etching process. By spatially attenuating the levels of IR energy that reach the wafer, the filter improves uniformity in the etching process.

DETAILED DESCRIPTION

Figure 1:
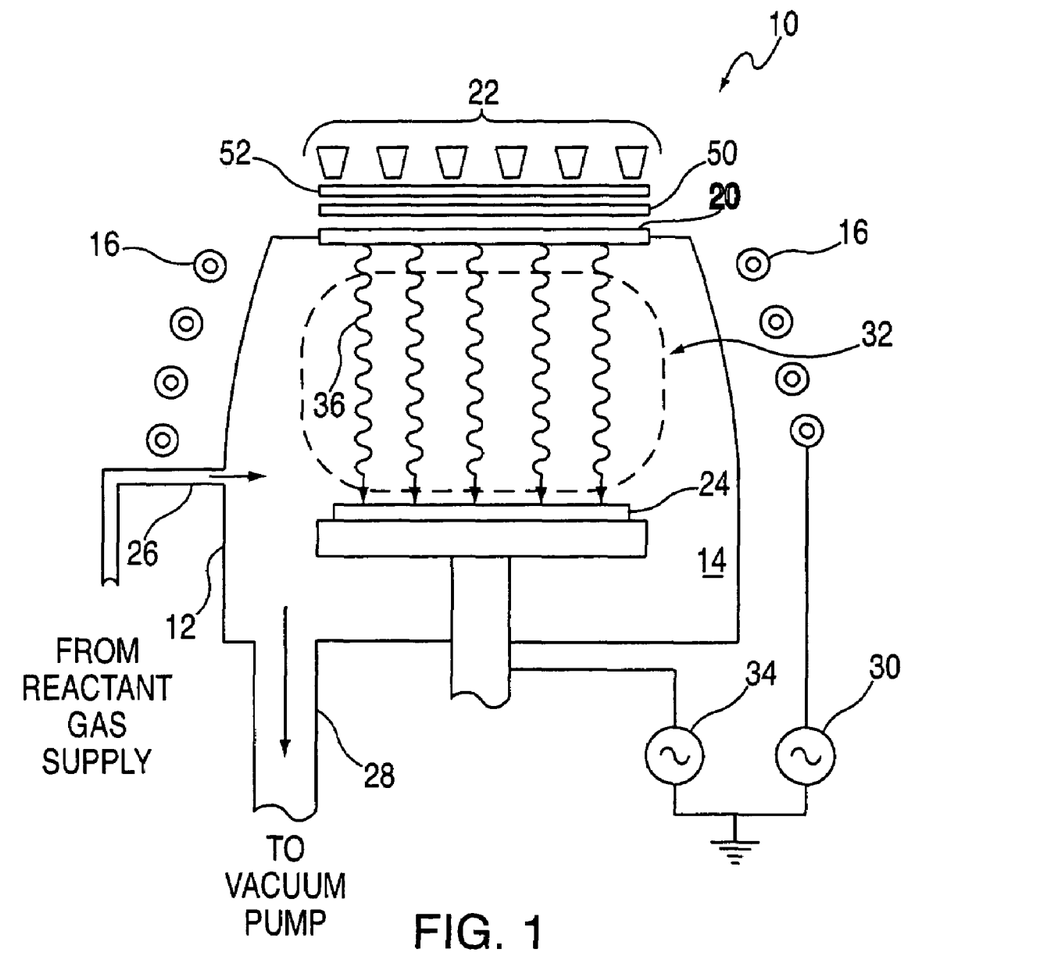
FIG. 1 is a schematic diagram of a resonance plasma etching system.

Referring now to the drawings, wherein like numeral refer to like parts throughout, there is seen in FIG. 1 a plasma etch system 10 comprising a chamber 12, a wafer chuck 14, solenoid coils 16, a transmissive window 20 position in the top of chamber 12, and IR sources 22. A wafer 24 is positioned on top of wafer chuck 14. Chamber 12 is fitted with an inlet 26 for receiving a reactant gas supply and an exhaust port 28 for expelling reactant gas.

A radio frequency (RF) power supply 30 is coupled to solenoid coils 16 and to ground in order to strike and maintain a free radical plasma 32 and an RF bias power supply 34 is coupled to wafer chuck 14 and to ground in order to control forward bias (etch) power. IR sources 22 generate infrared radiation 36, which pass through window 20 to strike the surface of wafer 24.

Figure 2:
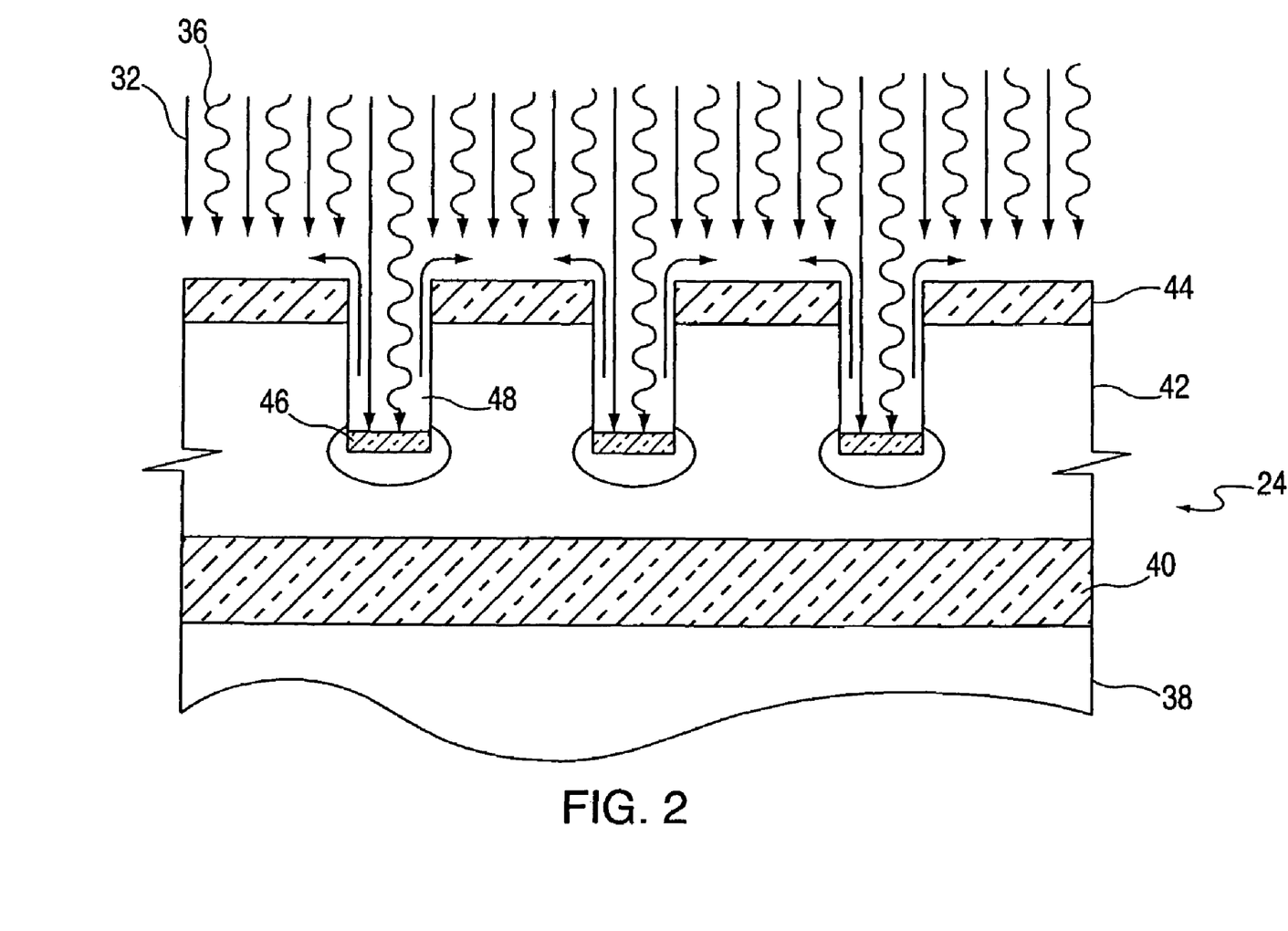
FIG. 2 is a schematic diagram of the etching process of a chip manufactured according to the present invention.

As seen in FIG. 2, etching occurs when wafer 24, comprising a substrate 38 and an insulator 40 that has been coated with an etchable conductor layer 42 and a masking layer 44, is exposed to free radical plasma 32. Free radical plasma 32 chemically interacts with the surface of wafer 24 to form a secondary compound 46 that, in the presence of heat, will evaporate. As exposure to free radical plasma 32 and evaporation of secondary compound 46 continues, a trench 48 will form in etchable conductor layer 42.

Due to the partial pressure of secondary compound 46, evaporation may not occur at a temperature that is low enough to prevent damage to other components of wafer 24. As further seen in FIG. 2, selected wavelengths of infrared radiation 36 are applied to wafer 34 in combination with plasma 32 to lower the temperature at which etching will occur. Referring to FIG. 1, the wavelength of infrared radiation 36 is controlled by the use of a wavelength filter 52 that filters out undesirable wavelengths while allowing select wavelengths to pass through to window 20. The particular wavelength of infrared radiation 36 is selected so that it will couple with and excite the vibrational state of the secondary compound formed by the interaction of the surface of wafer 24 and the free radical plasma 32 used in the etching process, thereby selectively heating only those areas of wafer 24 to be etched.

For example, plasma etching of a copper-coated wafer 24 in the presence of chlorine gas results in the formation of a layer of copper chloride ($CuCl_2$) in the non-masked areas of wafer 24. Due to the partial pressure of $CuCl_2$, the surface of wafer 24 will be passivated at temperatures below 600 degrees F. and no etching will occur. Radiating with infrared radiation 36 at a resonance wavelength will effectively lower the temperature at which the layer of $CuCl_2$ formed on the area of wafer 24 will evaporate to form the etching. By contrast, the surrounding areas of wafer 36 that are masked to prevent the formation of $CuCl_2$ will be heated to a lesser degree as selected wavelength infrared radiation 30 will not induce resonance in those regions.

Figure 3:
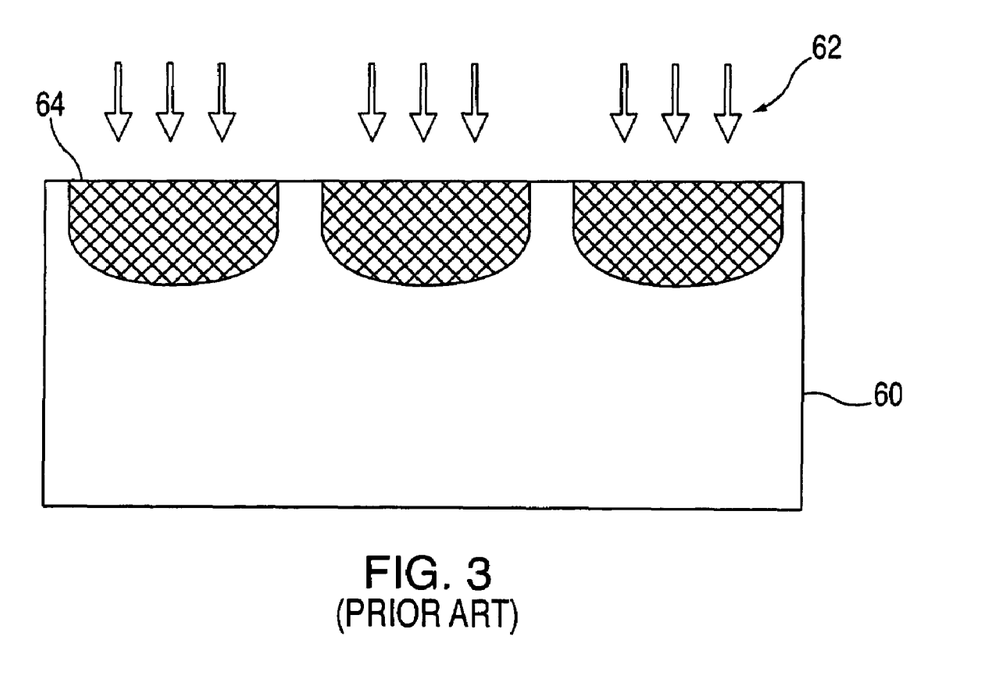
FIG. 3 is a schematic diagram of a chip manufactured according to a prior art method.
Figure 4:
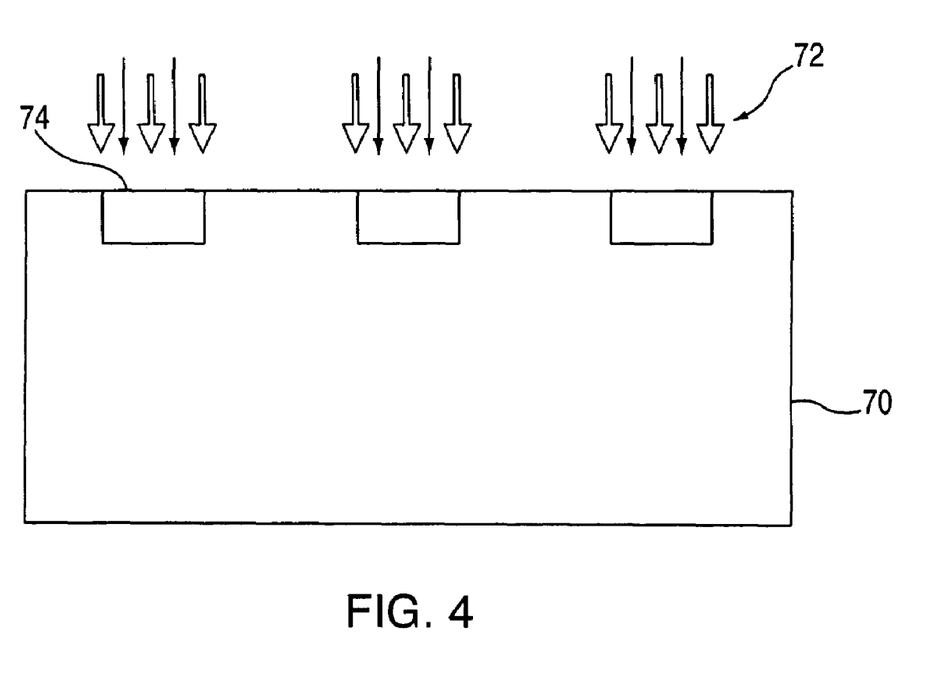
FIG. 4 is a schematic diagram of a chip manufactured according to the present invention.

Referring to FIG. 3, a wafer 60 processed by prior art, non-resonant infrared radiation 62 forms non-discrete heating zones 64. Referring to FIG. 4, a wafer 70 processed with resonant infrared radiation 72 will, however, form heating zones 74 having a finer resolution. By creating zones 74 having finer resolution, resonant radiation 72 allow for more exact etching and an increased density of circuits in wafer 70, thereby improving both the quality and overall performance of the etching process.

Referring to FIG. 1, plasma etch system 10 further includes a filter or mask 50 which spatially attenuates the strength of infrared radiation 30 to compensate for spatial etch distortions, i.e., non-uniformities in the amount of etching that occurs in various regions of a wafer 24, thereby allowing for improved wafer processing. Filter 50 for spatially attenuating infrared radiation 30 may be separate from wavelength filter 52, or the functions of both filters 50 and 52 may be combined into a single filter that selects for the resonant frequency and spatially attenuates to remove non-uniformities.

Figure 5:
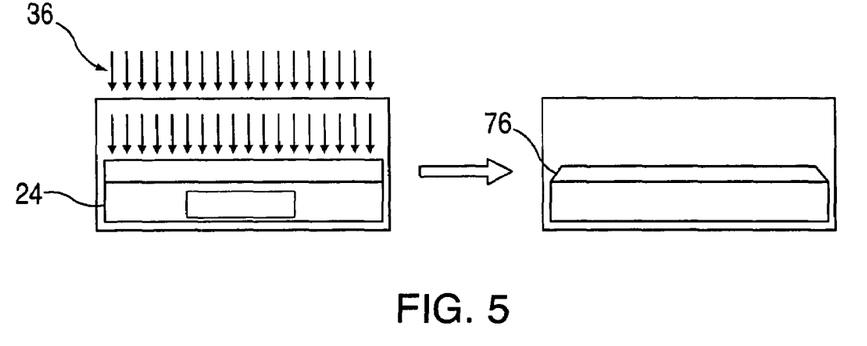
FIG. 5 is a schematic diagram of edge fast etching of a chip due to micro-loading.
Figure 6:
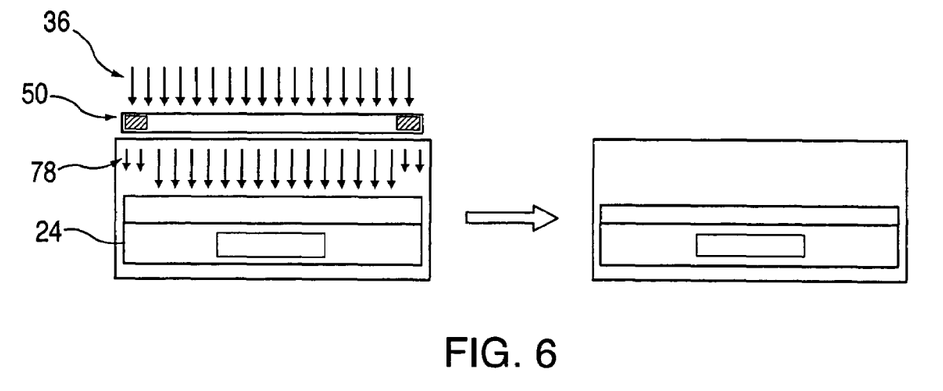
FIG. 6 is a schematic diagram of the attenuation of infrared intensity to prevent edge fast etching according to the present invention.
Figure 7A:
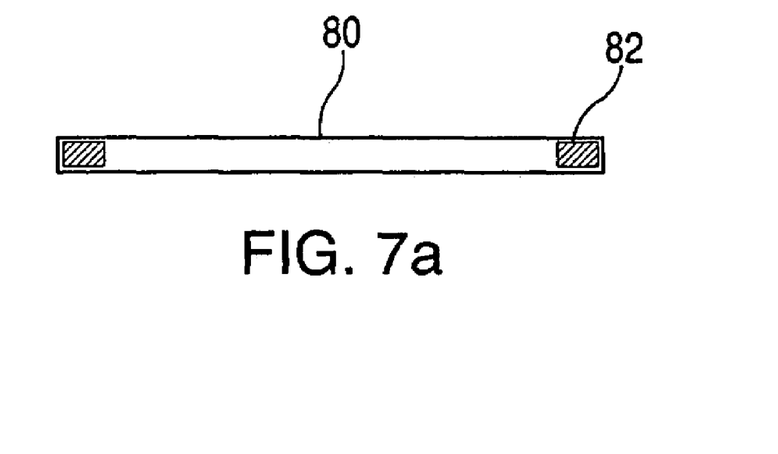
FIGS. 7a and 7b are side elevation and top plan views, respectively, of a filter manufactured according to the present invention to prevent edge fast etching.
Figure 7B:
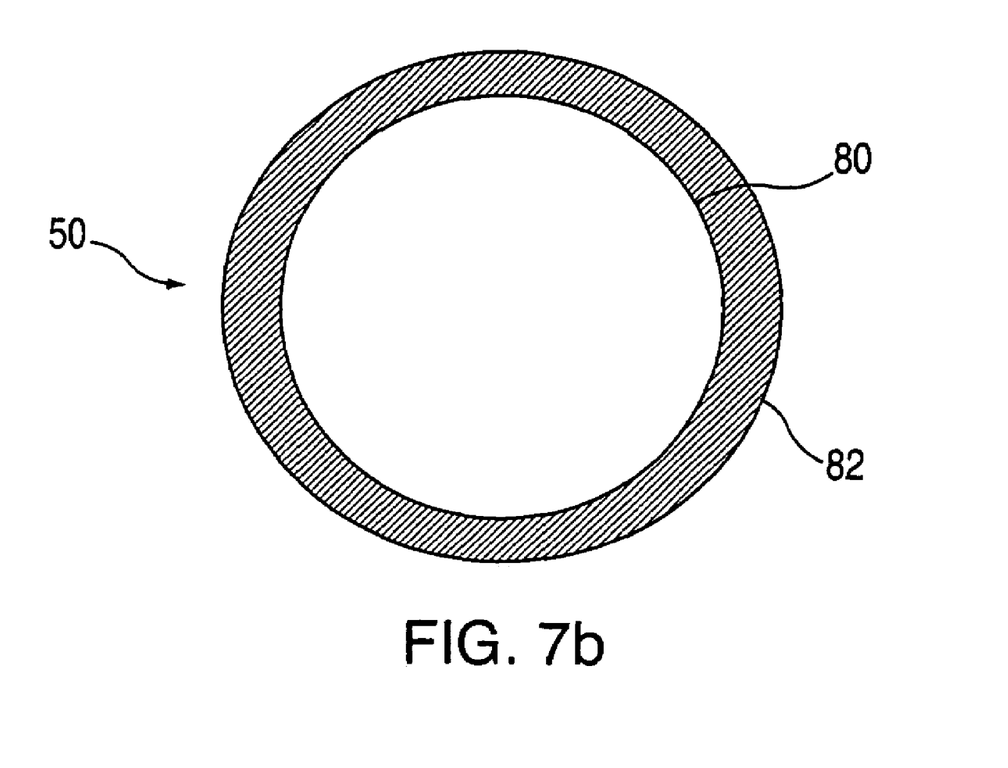

Referring to FIG. 5, unfiltered etching of wafer 24 may result in edge fast etching 76 due to macro-loading. Referring to FIGS. 6 and 7, filter 50 having spatial variations in transmission which mirror or are complementary to the non-uniformities will attenuate the infrared intensity at the edge of wafer 24 to compensate for macro-loading and allow for uniform etching. To prevent edge fast etching, filter 50 has a central region 80 having high transmittance and a peripheral region 82 having low transmittance to slow the etching of the edge of wafer 24.

Figure 8:
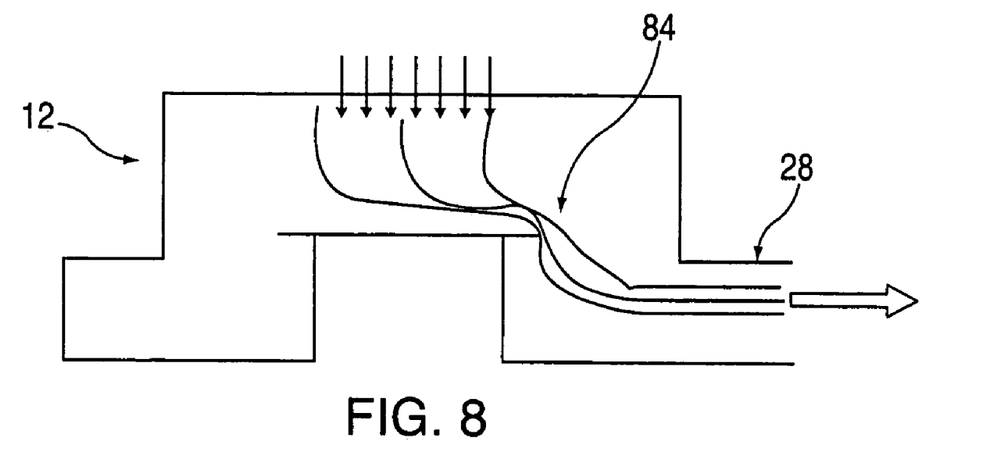
FIG. 8 is a schematic diagram of asymmetric pumping in a plasma etch reactor.
Figure 9:
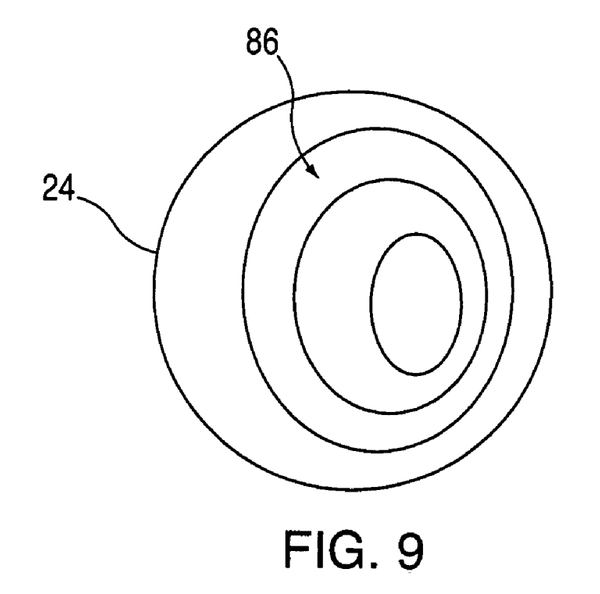
FIG. 9 is a top plan view of the asymmetric etch profile of a wafer subject to asymmetric pumping in a plasma etch reactor.
Figure 10:
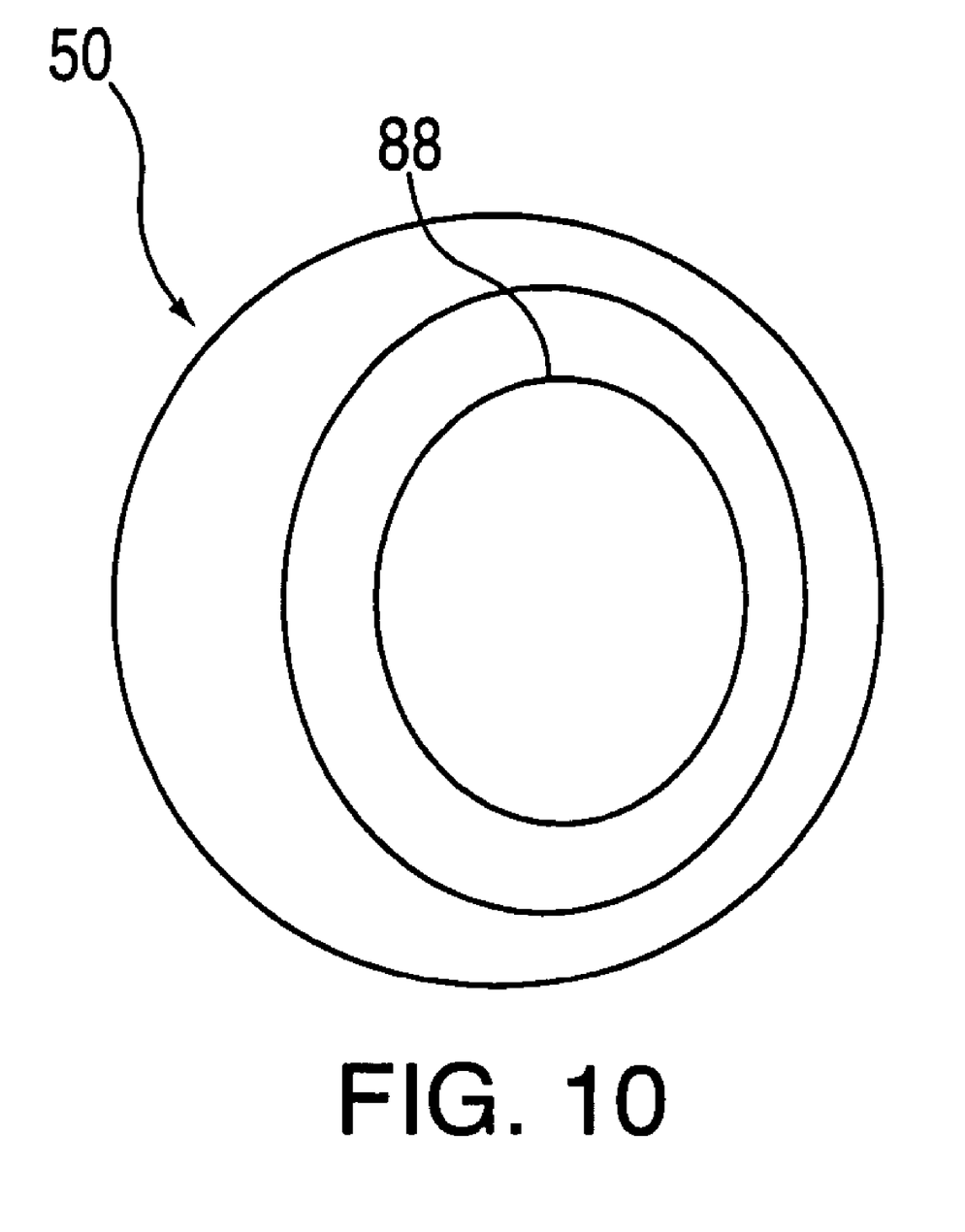
FIG. 10 is a top plan view of a filter manufactured according to the present invention to prevent an asymmetric etch profile.

Referring to FIG. 8, asymmetric pumping of plasma 32 in chamber 12 results in the formation of non-uniformities in wafer 24. When port 28 is positioned on one side of chamber 12, the non-uniform flow 84 of reactant gas will lead to areas of non-uniform etching. With reference to FIG. 9, a non-uniform etch profile 86 is formed on wafer 24 when subjected to asymmetric pumping. Referring to FIG. 10, filter 50 may be designed with a series of eccentric regions 88 having gradually decreased transmittance to compensate for etch profile 86 and spatially attenuate the etching of wafer 24 to smooth the non-uniformities.

Figure 11:
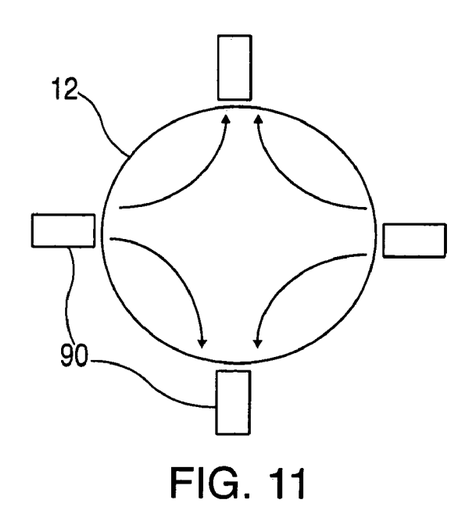
FIG. 11 is a schematic diagram of magnetic filed cusping is an etch reactor having electromagnets.
Figure 12:
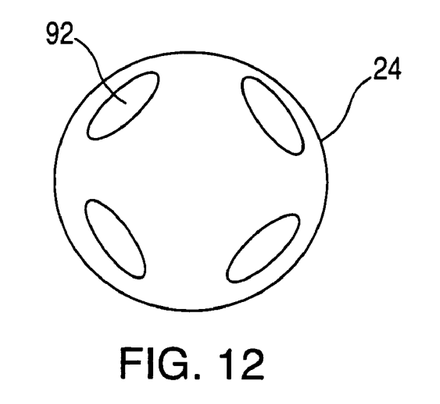
FIG. 12 is a top plan view of the non-uniformities in the etch profile in a wafer subjected to magnetic field cusping.
Figure 13:
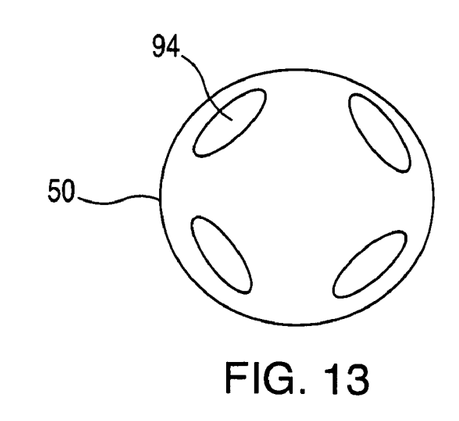
FIG. 13 is a top plan view of a filter manufactured according to the present invention to prevent non-uniformities in the etch profile in a wafer caused by magnetic field cusping.

Referring to FIG. 11, magnetic field cusping of chamber 12 may also cause non-uniformities in the plasma etching of wafer 24. During etching, magnetic lines of force from electromagnets 90 positioned around chamber 12 cause "cusp" regions that affect etch uniformity. Referring to FIG. 12, non-uniformities 92 are formed in wafer 24 when subjected to magnetic field cusping. Referring to FIG. 13, filter 50 may be designed to include complementary regions of variable transmission 94 that mirror non-uniformities 92 and improve uniformity in the etching of wafer 24.

Filter 50 may comprise standard linear variable metallic neutral density filters that are modified to have transmission patterns according to the present invention. The appropriate regions of variable transmission may be created in filter 50 by attenuating the intensity of the incident (IR) beam with metallic coatings. For example, an optical quality glass filter having aluminum coating that is protected by an overcoat may used to attenuate infrared intensity, although other coating materials could also be used. The spatial variations in the attenuating power of filter 50 can be achieved by varying the thickness of the film coating in the appropriate regions of filter 50 to mirror and attenuate the undesirable regions of non-uniformity.

What is claimed is:

1. A filter for reducing non-uniformities in a plasma etching process, comprising:
    a first region comprising a material having a first non-zero transmittance with respect to infrared wavelength(s) suitable for use in the plasma etching process, with the first non-zero transmittance being sufficiently large so that the infrared radiation transmitted is sufficient to etch plasma; and
    a second region comprising a material having second non-zero transmittance with respect to infrared wavelength(s) suitable for use in the plasma etching process that is different than said first non-zero transmittance with respect to infrared wavelength(s) suitable for use in the plasma etching process, with the second non-zero transmittance being sufficiently large so that the infrared radiation transmitted is sufficient to etch plasma.

2. The filter of claim 1, wherein said first region and said second region are eccentric.

3. The filter of claim 1, wherein said second region is positioned to reduce transmission in areas where said plasma etching process experiences magnetic field cusping.

4. The filter of claim 1 wherein:
    said first region is shaped to compensate for spatial etch distortions in the plasma etching process; and
    said second region is shaped to compensate for spatial etch distortions in the plasma etching process.

5. The filter of claim 1 wherein:
    said first region is further adapted to selectively transmit a resonant frequency of infrared radiation; and
    said second region is further adapted selectively transmit a resonant frequency of infrared radiation.

6. The filter of claim 1, wherein said first region comprises a perimeter of said filter and said second region comprises a center portion of said filter.

7. The filter of claim 6, wherein said first transmittance is lower than said second transmittance.

8. The filter of claim 1, wherein said filter comprises optical quality glass having a layer of metallic coating of a predetermined thickness.

9. The filter of claim 8, wherein the thickness of said layer of metallic coating varies to form said first and said second regions.

10. A filter for reducing non-uniformities in a plasma etching process, comprising:
   a first surface adapted to receive and transmit infrared radiation having wavelength(s) suitable for the plasma etching process; and
   a filtering structure having an area located to receive and transmit the infrared radiation through said first surface, with the filtering structure being characterized by a plurality of transmission regions, with said transmission regions of said plurality of transmission regions being respectively characterized by a metallic coating having different respective thicknesses and varying degrees of transmittance with respect to the infrared wavelength(s) suitable for the plasma etching process, and with said transmission regions of said plurality of transmission regions being distributed over said area so that they mirror spatial etch distortions that would occur in the plasma etching process absent the selective transmission of infrared radiation by said filtering structure;
   wherein the transmission regions of the plurality of transmission regions have a transmittance sufficiently large to sufficiently transmit infrared radiation to etch plasma.

11. A device for plasma etching of a wafer, the device comprising:
   an infrared radiation source adapted to emit infrared radiation having infrared wavelength(s) suitable for use in plasma etching;
   a wafer chuck adapted to secure the wafer at a wafer position; and
   an infrared filter located between said infrared source and the wafer position in a path of the emitted infrared radiation, the filter comprising:
      a first region comprising a material having a first non-zero transmittance with respect to the emitted infrared wavelength(s), with the first non-zero transmittance being sufficiently large so that the infrared radiation transmitted is sufficient to etch plasma, and
      a second region comprising a material having second non-zero transmittance with respect to the emitted infrared wavelength(s) that is less than said first non-zero transmittance with respect to the emitted infrared wavelength(s), with the second non-zero transmittance being sufficiently large so that the infrared radiation transmitted is sufficient to etch plasma.

* * * * *

UNITED STATES PATENT AND TRADEMARK OFFICE
CERTIFICATE OF CORRECTION

PATENT NO. : 7,645,356 B2
APPLICATION NO. : 10/721657
DATED : January 12, 2010
INVENTOR(S) : Panda et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 378 days.

Signed and Sealed this

Sixteenth Day of November, 2010

David J. Kappos
*Director of the United States Patent and Trademark Office*